(12) United States Patent
Cho

(10) Patent No.: US 6,408,166 B1
(45) Date of Patent: Jun. 18, 2002

(54) METHOD FOR CONTROLLING GAIN OF TRANSMISSION SIGNAL

(75) Inventor: Sung-Min Cho, Kumi-shi (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/366,295

(22) Filed: Aug. 2, 1999

(30) Foreign Application Priority Data

Aug. 7, 1998 (KR) ............................................. 98-32127

(51) Int. Cl.$^7$ ................................................. H04Q 7/20
(52) U.S. Cl. .................. 455/127; 455/194.2; 455/194.1
(58) Field of Search ........................... 455/127, 156.1, 455/174.1, 194.1, 194.2, 199.1, 245.1, 212, 219, 220, 572, 550, 13.4, 522, 501, 63, 67.3, 88, 218, 116, 117; 379/347, 389, 395, 404, 406, 420, 421, 388.03, 388.04, 388.07, 388.05; 330/51, 149, 254

(56) References Cited

U.S. PATENT DOCUMENTS

| | | | | |
|---|---|---|---|---|
| 3,806,663 A | * | 4/1974 | Peek et al. .................. | 455/572 |
| 3,963,868 A | * | 6/1976 | Randmere et al. ..... | 379/388.05 |
| 4,091,380 A | * | 5/1978 | Yu .............................. | 341/139 |
| 4,700,382 A | * | 10/1987 | Means et al. ................ | 379/390 |
| 4,864,573 A | * | 9/1989 | Horsten ........................ | 714/704 |
| 4,893,349 A | * | 1/1990 | Eastmond et al. ........... | 455/205 |
| 5,146,610 A | * | 9/1992 | Longshore et al. ......... | 455/35.1 |
| 5,191,606 A | * | 3/1993 | Juang .......................... | 379/391 |
| 5,276,917 A | * | 1/1994 | Vanhanen et al. ............. | 455/95 |
| 5,339,452 A | * | 8/1994 | Sugawara .................... | 455/212 |
| 5,627,857 A | * | 5/1997 | Wilson ........................ | 375/219 |
| 5,857,019 A | * | 1/1999 | Iglehart et al. .............. | 379/389 |
| 5,946,384 A | * | 8/1999 | Yee et al. .................... | 379/215 |
| 6,169,886 B1 | * | 1/2001 | Black et al. ................. | 455/127 |
| 6,181,949 B1 | * | 1/2001 | Ozluturk et al. ............ | 455/522 |
| 6,194,978 B1 | * | 2/2001 | Romano ...................... | 332/107 |

* cited by examiner

Primary Examiner—Dwayne Bost
Assistant Examiner—Jean A Gelin
(74) Attorney, Agent, or Firm—Dilworth & Barrese, LLP

(57) ABSTRACT

In accordance with the present invention, a method is disclosed for preventing noise spikes due to abrupt changes of a transmission signal in a cordless telephone. The method is comprised of two sub-methods where a first sub-method for controlling the gain of a transmission signal when a call is initiated, and a second sub-method for controlling the gain of a transmission signal when a call is terminated.

5 Claims, 3 Drawing Sheets

METHOD FOR CONTROLLING GAIN OF TRANSMISSION SIGNAL

BACKGROUND OF THE INVENTION

1. Field of the Invention

The present invention relates generally to communication systems, and in particular, to a method for controlling the gain of a transmission signal in a communication system.

2. Description of the Related Art

A communication system, such as a cordless telephone has a microphone for receiving a voice input (hereinafter "transmission signal") from a communicating or sending party. The microphone outputs the transmission signal to a receiving party. On the sending side of the communication link, the transmission signal is unmuted during a conversation (or call) state and the transmission signal is muted during an idle state. As a result, the transmission signal is sent to a receiving party only during a conversation or call state.

The transmission signal is switched from a mute state to an unmute state at the moment the communication system switches from the idle state to the call state. Likewise, the transmission signal switches from the unmute state to the mute state at the moment the communication system is switched from the call state to the idle state. As such, the transmission signal is abruptly changed, as it undergoes a state change (i.e., switch from the mute state to the unmute state and from unmute to mute). The abrupt change of state causes undesirable noise spikes in the transmission signal which deteriorate the speech quality. The noise spikes are generated primarily at an input stage of the microphone, composed of an operational amplifier.

FIG. 1 illustrates changes in a gain of the transmission signal in a conventional cordless telephone and FIG. 2 shows the corresponding operational state of the transmission signal. As illustrated in FIG. 1, the cordless telephone changes operational states in the following sequence: idle state→call state→idle state. In the idle state, the cordless telephone minimizes the gain of the transmission signal so as to mute the transmission signal. While in the idle state, when a call is initiated, the gain of the transmission signal abruptly increases so as to unmute the transmission signal. Further, when the cordless telephone re-enters the idle state after completion of the call, the gain of the transmission signal is abruptly decreased minimizing gain so as to mute the transmission signal. As described above, the gain of the transmission signal is abruptly switched when the call is both initiated and terminated. As previously stated, the abrupt switching of the transmission signal gain introduces noise spikes in the transmitter, as shown in FIG. 2. The noise spike cause a deterioration in speech quality, thereby reducing the reliability of the communication system. As such, there exists a need for a method of controlling the gain of a transmission signal to prevent noise spikes when a call is both initiated and terminated.

SUMMARY OF THE INVENTION

It is therefore an object of the present invention to provide a method for controlling a gain of a transmission signal to prevent noise spikes from being generated when a call is initiated and terminated.

According to the present invention, there is provided a method for gradually increasing the gain of an amplifier for amplifying a transmission signal (i.e., microphone output) to reach an unmute state, when a call is initiated comprising the steps of: determining when a call is initiated; increasing the gain of an amplifier in discrete steps to reach an unmute state; determining when the call is terminated; and decreasing the gain of the amplifier in discrete steps to reach a mute state upon termination of said call.

According to another aspect of the invention, there is provided a method for gradually decreasing the gain of an amplifier to reach a mute state when a call is terminated comprising the steps of: determining when a call is initiated; increasing the gain of a mute circuit for receiving a signal output from a microphone to reach an unmute state; determining when a call is terminated; and decreasing the gain of the mute circuit in discrete steps to reach a mute state upon termination of said call.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described hereinbelow with reference to the accompanying drawings. In the following description, well known functions or constructions are not described in detail since they would obscure the invention in unnecessary detail.

The present invention is generally directed to incrementally varying the gain of the transmission signal by degrees when the call is initiated and terminated, so as to prevent noise spikes which may arise from abrupt changes of the transmission signal gain.

Figure 1:
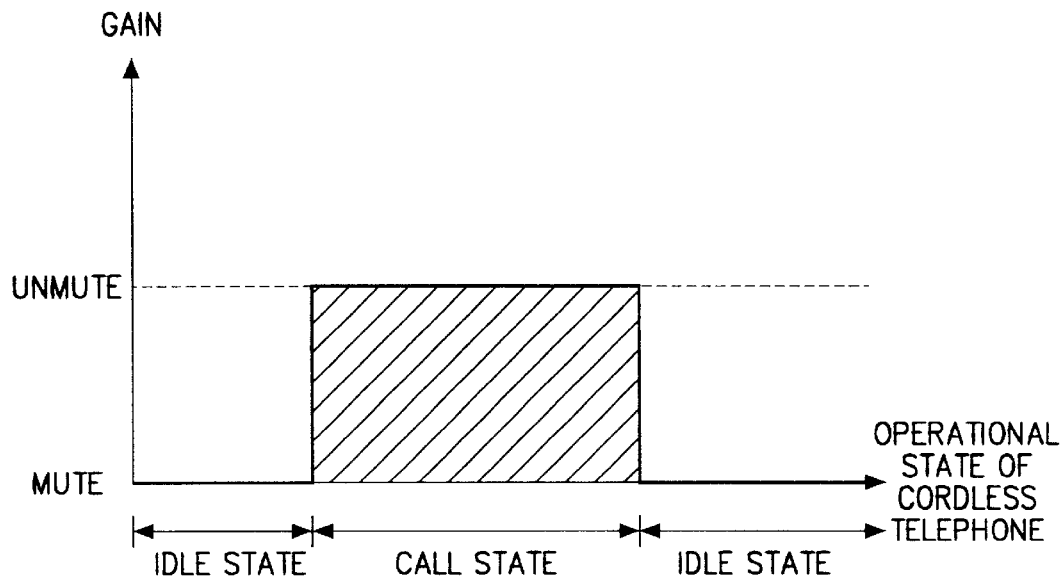
FIG. 1 is a graph illustrating change in a gain of a transmission signal in a conventional cordless telephone.
Figure 2:
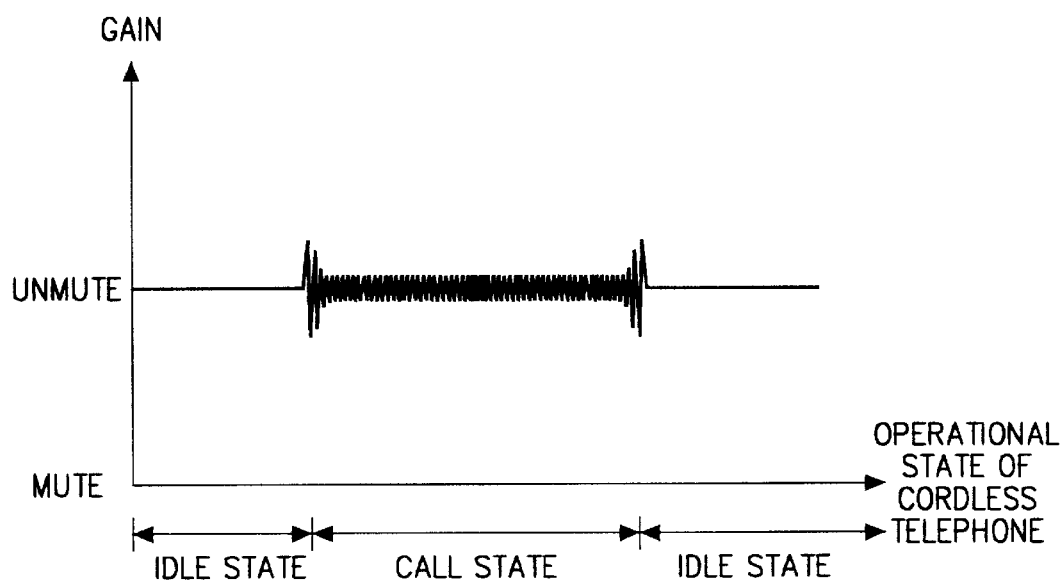
FIG. 2 is a graph illustrating a transmission signal with spike noises caused by an abrupt change of the transmission signal gain.
Figure 3:
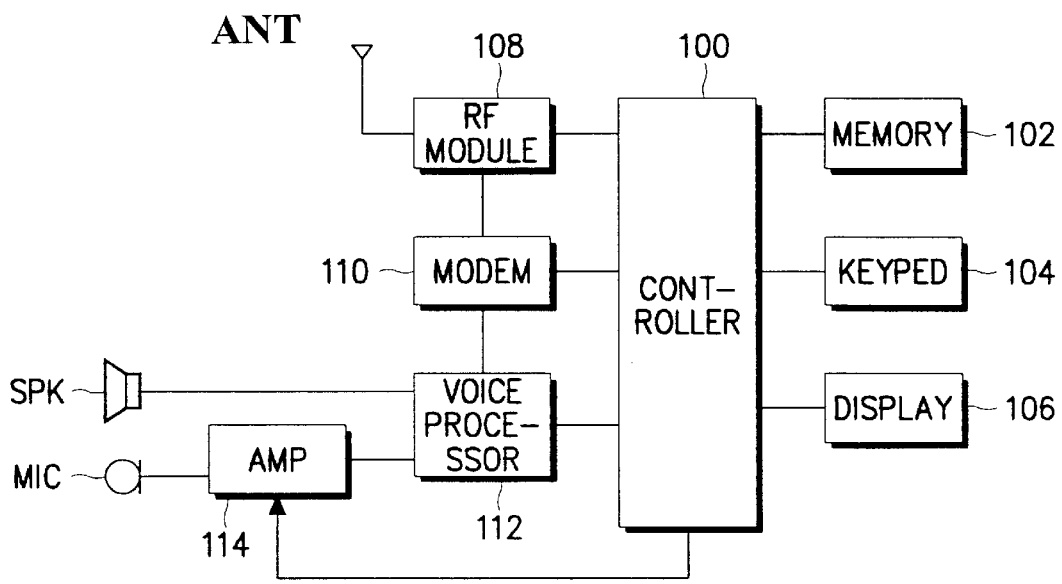
FIG. 3 is a block diagram of a cordless telephone according to the present invention.

FIG. 3 is a schematic block diagram of a cordless telephone according to an embodiment of the present invention. A controller 100 controls the overall operations of the cordless telephone, and in particular, the gain of the transmission signal. A memory 102 preferably includes a ROM (Read Only Memory) for storing a control program for the controller 100 and various information, and a RAM (Random Access Memory) for temporarily storing information generated in the process of the control program. A keypad 104 includes keys for inputting various user's commands and provides the controller 100 with key data generated by user's key manipulation. A display 106 displays various states of the cordless telephone under the control of the controller 100.

An RF (Radio Frequency) module 108 demodulates data received through an antenna ANT to provide the data to a modem 110, and modulates data output from the modem 110 to radiate the data through the antenna ANT. The modem 110 converts the data input from the RF module 108 to an analog signal to provide it to a voice processor module 112, and converts the analog signal input from the voice processor 112 to data to provide the data to the RF module 108. The voice processor module 112 removes noise from the analog signal received from modem 110, amplifies the noiseless analog signal, and then outputs the amplified noiseless analog signal to a speaker SPK. Further, the voice processor module 112 removes noise from a signal input from a microphone MIC through an amplifier 114, amplifies the noiseless signal, and then provides the amplified signal to the modem 110. The amplifier 114 amplifies the transmission signal from the microphone MIC under the control of the controller 100 and provides the amplified transmission signal to the voice processor 112. It should be appreciated that in an alternate embodiment, the amplifier 114 can be replaced with a mute circuit. In such a case, the mute circuit amplifies the transmission signal under the control of the controller 100 and provides the amplified transmission signal to the voice processor 112.

The controller 100 increases the gain of the amplifier 114 incrementally to reach an unmute (i.e., call initiation) state preferably within 0.5–2 seconds. Likewise, the controller 100 decreases the gain of the amplifier 114 incrementally to reach the mute (i.e., call termination) state preferably within 0.5–2 seconds.

Similarly, in the case where the amplifier 114 is replaced with a mute circuit, the controller 100 increases the gain of the mute circuit incrementally to reach the umnute state when the call is initiated, and likewise decreases the gain of the mute circuit incrementally to reach the mute state when the call is terminated.

Figure 4:
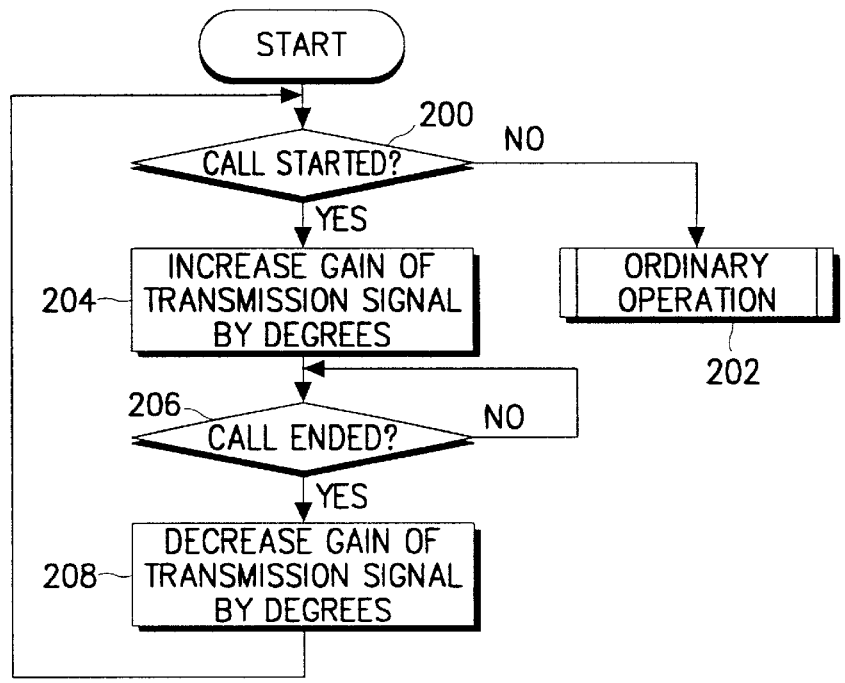
FIG. 4 is a flowchart illustrating a method for controlling a gain of a transmission signal according to the present invention.

FIG. 4 is a flowchart illustrating a method for controlling the gain of a transmission signal according to an embodiment of the present invention. The controller 100 determines in step 200 whether the call to a receiving party connection has been made. If the call connection was not made, the controller 100 performs an ordinary operation in step 202. However, if the call was initiated, the controller 100, in step 204, increases the gain of the amplifier 114 by degrees (incrementally increasing the gain –80 dB, –70 dB, –60 dB, –50 dB, –40 dB . . . ) preferably within 0.5–2 seconds to reach the unmute state. After increasing the gain of the transmission signal, the controller 100 determines in step 206 whether the call has terminated. If the call has not terminated, the controller remains in the loop until the call terminates. When the call terminates, the controller 100 in step 208 decreases the gain of the amplifier 114 by degrees preferably within 0.5–2 seconds to reach the mute state.

Figure 5:
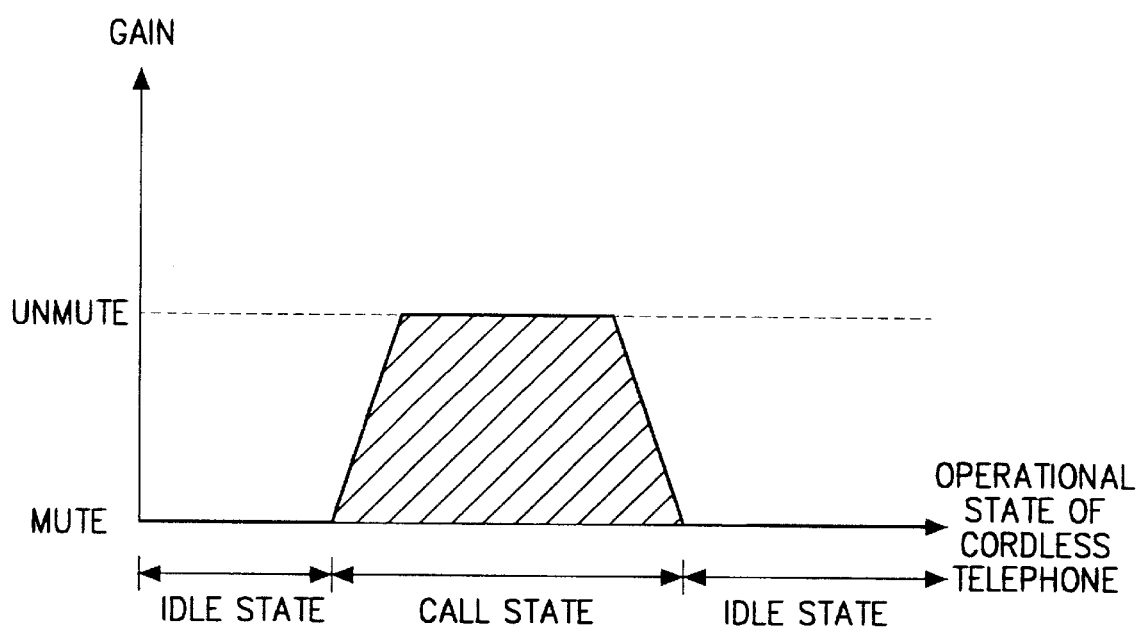
FIG. 5 is a diagram illustrating changes in a gain of a transmission signal according to the present invention.

FIG. 5 illustrates changes in the gain profile of a transmission signal when a call is initiated, (i.e., the operational state of the cordless telephone is switched from the idle state to the call state) the gain of the transmission signal is incrementally increased. Further, when the call is terminated, (i.e., when the operational state of the cordless telephone is switched from the call state to the idle state) the gain of the transmission signal is incrementally decreased.

As described above, the communication system of the present invention varies the gain of the transmission signal incrementally to prevent an abrupt change of the transmission signal, thereby preventing the generation of the noise spikes.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for controlling the gain of a transmission signal, comprising the steps of:

determining when a call is initiated;

increasing the gain of an amplifier incrementally to prevent noise spikes to reach an unmute state upon initiation of said call;

determining when the call is terminated; and decreasing the gain of the amplifier incrementally to reach a mute state upon termination of said call.

2. The method according to claim 1, wherein the unmute state is reached within 0.5 to 2 seconds.

3. The method according to claim 1, wherein the gain of the amplifier is increased in response to a control signal provided by a controller.

4. A method for controlling a gain of a transmission signal, comprising the steps of:

determining when a call is initiated;

increasing the gain of a mute circuit for receiving a signal output from a microphone incrementally to prevent noise spikes to reach an unmute state upon initiation of said call;

determining when the call is terminated; and decreasing the gain of the mute circuit incrementally to reach a mute state upon termination of said call.

5. The method according to claim 4, wherein the gain of the mute circuit is increased in response to a control signal provided by a controller.

\* \* \* \* \*